United States Patent
Mizuguchi et al.

(10) Patent No.: US 10,930,533 B2
(45) Date of Patent: Feb. 23, 2021

(54) SUBSTRATE PROCESSING APPARATUS, SUBSTRATE PROCESSING SYSTEM AND METHOD OF MANUFACTURING SEMICONDUCTOR DEVICE

(71) Applicant: KOKUSAI ELECTRIC CORPORATION, Tokyo (JP)

(72) Inventors: Yasuhiro Mizuguchi, Toyama (JP); Naofumi Ohashi, Toyama (JP); Tadashi Takasaki, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 98 days.

(21) Appl. No.: 16/263,826

(22) Filed: Jan. 31, 2019

(65) Prior Publication Data

US 2019/0287831 A1 Sep. 19, 2019

(30) Foreign Application Priority Data

Mar. 14, 2018 (JP) .............................. JP2018-047207

(51) Int. Cl.
*H01L 21/67* (2006.01)
*H01J 37/32* (2006.01)
(Continued)

(52) U.S. Cl.
CPC .... *H01L 21/67259* (2013.01); *C23C 16/4412* (2013.01); *C23C 16/52* (2013.01);
(Continued)

(58) Field of Classification Search
CPC ......... H01L 21/67259; H01L 21/67742; H01L 21/67167; H01L 21/67161; H01L 21/68;
(Continued)

(56) References Cited

U.S. PATENT DOCUMENTS 6,530,136 B1 * 3/2003 Komiyama ....... H01L 21/67196
29/464
7,280,883 B2 * 10/2007 Kitamoto ............. G05B 19/418
700/121

(Continued)

FOREIGN PATENT DOCUMENTS

JP 2008-021835 A 1/2008
JP 2015-115540 A 6/2015
(Continued)

OTHER PUBLICATIONS

Taiwanese Office Action dated Dec. 20, 2019 for the Taiwanese Patent Application No. 108103868.

(Continued)

*Primary Examiner* — Nha T Nguyen
(74) *Attorney, Agent, or Firm* — Volpe Koenig

(57) ABSTRACT

Described herein is a technique capable of capable of managing a substrate processing apparatus efficiently. According to one aspect of the technique described herein, there is provided a substrate processing apparatus including: a process chamber where a substrate is processed; a position information acquisition part configured to acquire position information of the process chamber; a memory device configured to store the position information; and an information controller configured to cause the position information acquired by the position information acquisition part to be stored in the memory device and the position information stored in the memory device to be outputted.

9 Claims, 9 Drawing Sheets

(51) Int. Cl.
*C23C 16/44* (2006.01)
*H01L 21/68* (2006.01)
*C23C 16/52* (2006.01)
*H01L 21/677* (2006.01)

(52) U.S. Cl.
CPC .. *H01J 37/32357* (2013.01); *H01J 37/32889* (2013.01); *H01J 37/32926* (2013.01); *H01L 21/67161* (2013.01); *H01L 21/67167* (2013.01); *H01L 21/67742* (2013.01); *H01L 21/68* (2013.01)

(58) Field of Classification Search
CPC ........... H01J 37/32926; H01J 37/32889; H01J 37/32357; C23C 16/4412; C23C 16/52
See application file for complete search history.

(56) References Cited

U.S. PATENT DOCUMENTS

| | | | | |
|---|---|---|---|---|
| 8,135,560 | B2* | 3/2012 | Schauer | C23C 14/505 |
| | | | | 702/145 |
| 9,915,938 | B2* | 3/2018 | Takeda | G05B 19/4184 |
| 10,496,078 | B2* | 12/2019 | Yamamoto | G05B 19/418 |
| 2003/0023340 | A1* | 1/2003 | Kitamoto | G05B 19/4184 |
| | | | | 700/121 |
| 2003/0040269 | A1* | 2/2003 | Yokoyama | F24F 3/161 |
| | | | | 454/52 |
| 2003/0099535 | A1* | 5/2003 | Miyazaki | H01L 21/67167 |
| | | | | 414/788 |
| 2003/0204528 | A1 | 10/2003 | Su et al. | |
| 2009/0000104 | A1* | 1/2009 | Yamazaki | H01L 21/67161 |
| | | | | 29/428 |
| 2009/0265322 | A1* | 10/2009 | Asai | G05B 19/4183 |
| 2011/0035043 | A1* | 2/2011 | Liu | H01L 21/67253 |
| | | | | 700/110 |
| 2014/0025677 | A1* | 1/2014 | Asai | G06F 16/13 |
| | | | | 707/737 |
| 2014/0240484 | A1* | 8/2014 | Kodama | G02B 27/017 |
| | | | | 348/86 |
| 2015/0318198 | A1* | 11/2015 | Kuwahara | H01L 21/68 |
| | | | | 414/222.02 |
| 2016/0078163 | A1 | 3/2016 | Koshimaki et al. | |
| 2016/0247699 | A1* | 8/2016 | Kamimura | H01L 21/67769 |
| 2016/0293459 | A1* | 10/2016 | Cha | H01L 21/67736 |
| 2017/0159181 | A1 | 6/2017 | Toyoda et al. | |
| 2017/0193243 | A1* | 7/2017 | Numomura | G06F 21/31 |
| 2018/0190521 | A1* | 7/2018 | Ueda | H01L 21/6719 |
| 2018/0350642 | A1* | 12/2018 | Mizuguchi | H01L 21/67288 |

FOREIGN PATENT DOCUMENTS

| | | |
|---|---|---|
| JP | 2015-225972 A | 12/2015 |
| JP | 2017-103356 A | 6/2017 |
| KR | 101786899 B1 | 10/2017 |
| WO | 2014/189045 A1 | 11/2014 |

OTHER PUBLICATIONS

Korean Office Action dated May 19, 2020 for the Korean Patent Application No. 10-2019-0010504.
Japanese Office Action dated Oct. 28, 2019 for the Japanese Patent Application No. 2018-047207.

* cited by examiner

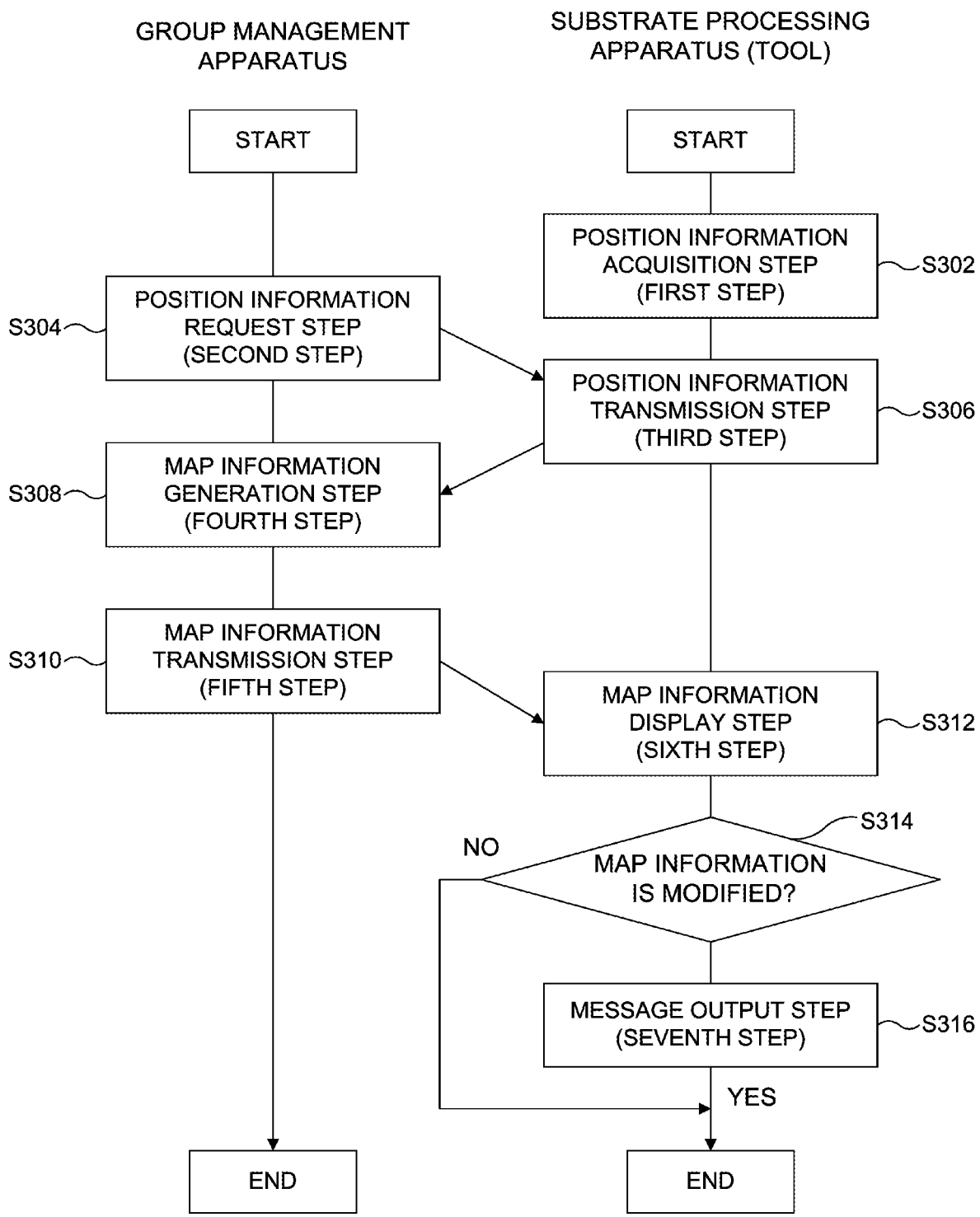

SUBSTRATE PROCESSING APPARATUS, SUBSTRATE PROCESSING SYSTEM AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2018-047207, filed on Mar. 14, 2018, in the Japanese Patent Office, the entire contents of which are hereby incorporated by reference.

BACKGROUND

1. Field

The present disclosure relates to a substrate processing apparatus, a substrate processing system and a method of manufacturing a semiconductor device.

2. Description of the Related Art

A substrate processing apparatus including a reactor is used in manufacturing processes of a semiconductor device, for example. In the substrate processing apparatus, information on, e.g., the operation of the substrate processing apparatus is displayed by an input/output device such as a display so that a manager of the apparatus may confirm the information on, e.g., the operation of the substrate processing apparatus. In addition, a plurality of substrate processing apparatuses are installed in a clean room for manufacturing the semiconductor device, and each substrate processing apparatus is managed via a network.

SUMMARY

Described herein is a technique capable of managing a substrate processing apparatus efficiently.

According to one aspect of the technique described herein, there is provided a substrate processing apparatus including:
a process chamber where a substrate is processed;
a position information acquisition part configured to acquire position information of the process chamber;
a memory device configured to store the position information; and
an information controller configured to cause the position information acquired by the position information acquisition part to be stored in the memory device and the position information stored in the memory device to be outputted.

BRIEF DESCRIPTION OF THE DRAWINGS

FIG. 9 is a flowchart schematically illustrating a method of managing the substrate processing apparatus of the substrate processing system according to the embodiments described herein.

DETAILED DESCRIPTION

<Embodiments>

Hereinafter, one or more embodiments according to the technique will be described with reference to the drawings.

(1) Issues Related to Management of Substrate Processing Apparatus

First, major issues related to the management of a substrate processing apparatus used in a manufacturing process of a semiconductor device will be described. There are following issues with the recent manufacturing process of the semiconductor device.

The first issue is that the improvement of the production efficiency is required. In order to improve the production efficiency of the semiconductor device, for example, the number of substrate processing apparatuses in operation in a clean room should be increased. In addition, in order to shorten the downtime of each substrate processing apparatus, it is necessary to shorten the maintenance time of each substrate processing apparatus. Therefore, when the number of the substrate processing apparatuses is increased, it is necessary to quickly and accurately grasp the operating status of each substrate processing apparatus in the clean room in order to improve the production efficiency.

The second issue is that recent semiconductor devices require higher integration and miniaturization of circuits provided therein, for example. Since the circuits are manufactured though a plurality of processes, a plurality of substrate processing apparatuses respectively corresponding to the processes are prepared. In addition, the substrate processing apparatuses corresponding to consecutive processes are often provided in the same clean room. That is, in order to achieve the higher integration and miniaturization of the circuits, it is necessary to decide carefully where to place each of the substrate processing apparatuses in the clean room.

The third issue is that, as various films and circuits have been developed year by year recently, the clean room for manufacturing the semiconductor device needs to cope with producing such various films and circuits. For example, a substrate processing apparatus used for a specific process may be replaced with a high-performance substrate processing apparatus capable of producing a new circuit, or a substrate processing apparatus capable of forming a completely different film. If the substrate processing apparatuses are replaced repeatedly, it may become difficult to arrange substrate processing apparatuses corresponding to consecutive processes nearby in the clean room. Therefore, it is required to appropriately manage each of the substrate processing apparatuses in the clean room on the premise that they may be replaced by other apparatuses when it becomes necessary as a measure for coping with, for example, a new circuit.

Hereinafter, the technique for addressing at least one of the above-described issues will be described based on the embodiments.

(2) Configuration of Substrate Processing System

Figure 1:
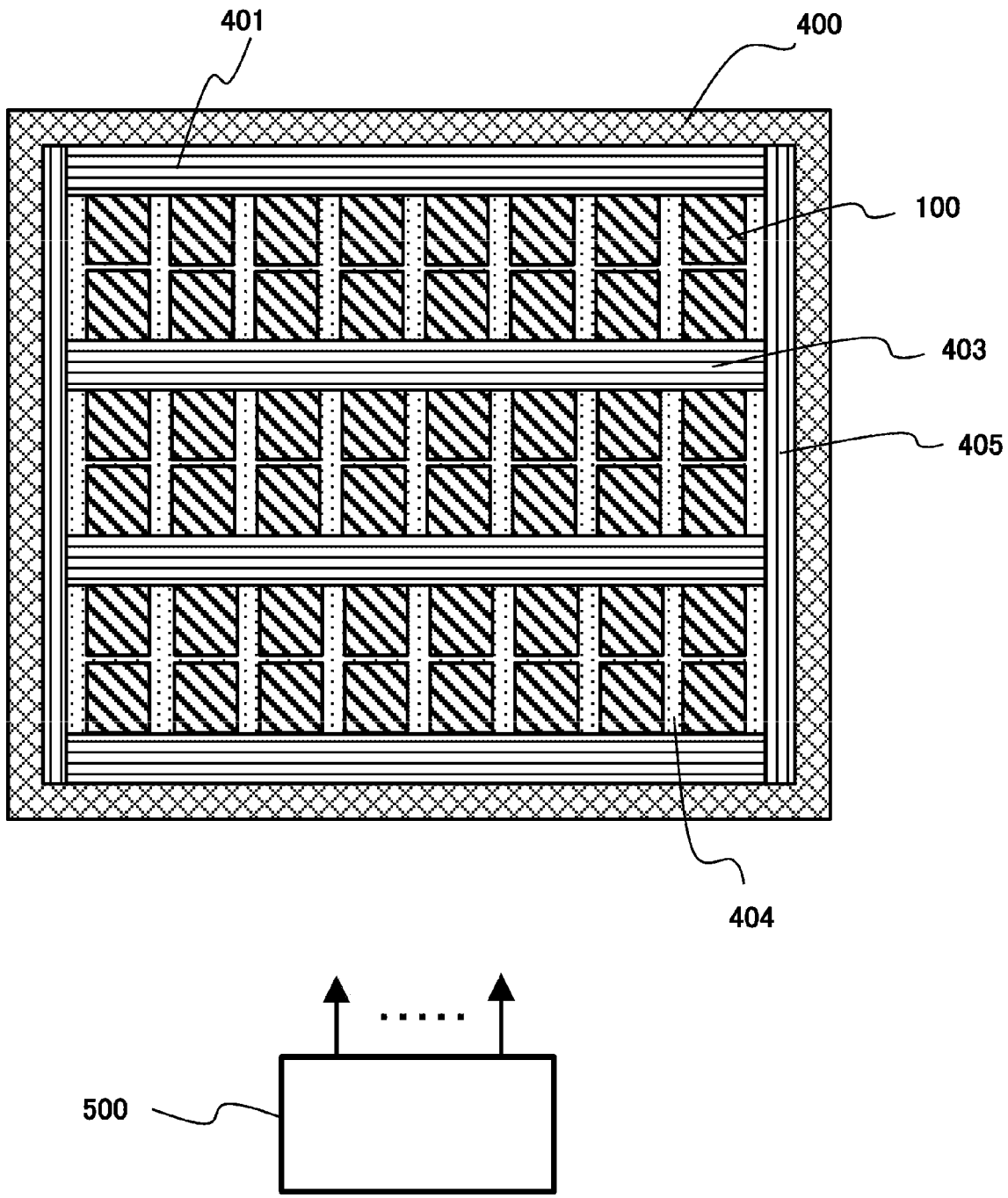
FIG. 1 schematically illustrates a configuration of a substrate processing system according to one or more embodiments described herein.

Hereinafter, a substrate processing system according to the embodiments will be described. FIG. 1 schematically illustrates a configuration of the substrate processing system according to the embodiments.

As shown in FIG. 1, the substrate processing system includes a plurality of substrate processing apparatuses 100 installed in a clean room (hereinafter, also referred to as "CR") 400 and a group management apparatus 500 serving as a host apparatus configured to manage each substrate processing apparatus 100.

In the CR 400, a main corridor 403, a maintenance region 404 and a side corridor 405 are provided on a floor 401. The floor 401 is partitioned into a plurality of sections by the main corridor 403, the maintenance region 404 and the side corridor 405.

A substrate processing apparatus 100 is arranged in each section on the floor 401. The substrate processing apparatus 100 is capable of performing a predetermined substrate processing on a semiconductor wafer substrate (hereinafter, simply referred to as "wafer") on which a semiconductor integrated circuit device (hereinafter, simply referred to as a semiconductor device) is fabricated. In principle, only one substrate processing apparatus 100 is arranged in each section. However, depending on the model (or the kind of processing) of the substrate processing apparatus 100, the substrate processing apparatus 100 may be arranged so as to occupy a plurality of sections. A plurality of types of substrate processing apparatuses 100 may coexist in the CR 400. These substrate processing apparatuses 100 correspond to the respective processes for manufacturing the semiconductor device. In addition, it should be noted that the substrate processing apparatuses 100 may be replaced as necessary.

The group management apparatus 500 is constituted by a computer serving as the host apparatus of each substrate processing apparatus 100. The group management apparatus 500 can transmit and receive information to and from each substrate processing apparatus 100 via a wireless or wired network (not shown).

Hereinafter, the substrate processing apparatus 100 and the group management apparatus 500 constituting the substrate processing system will be described in detail.

(3) Configuration of Substrate Processing Apparatus

Figure 2:
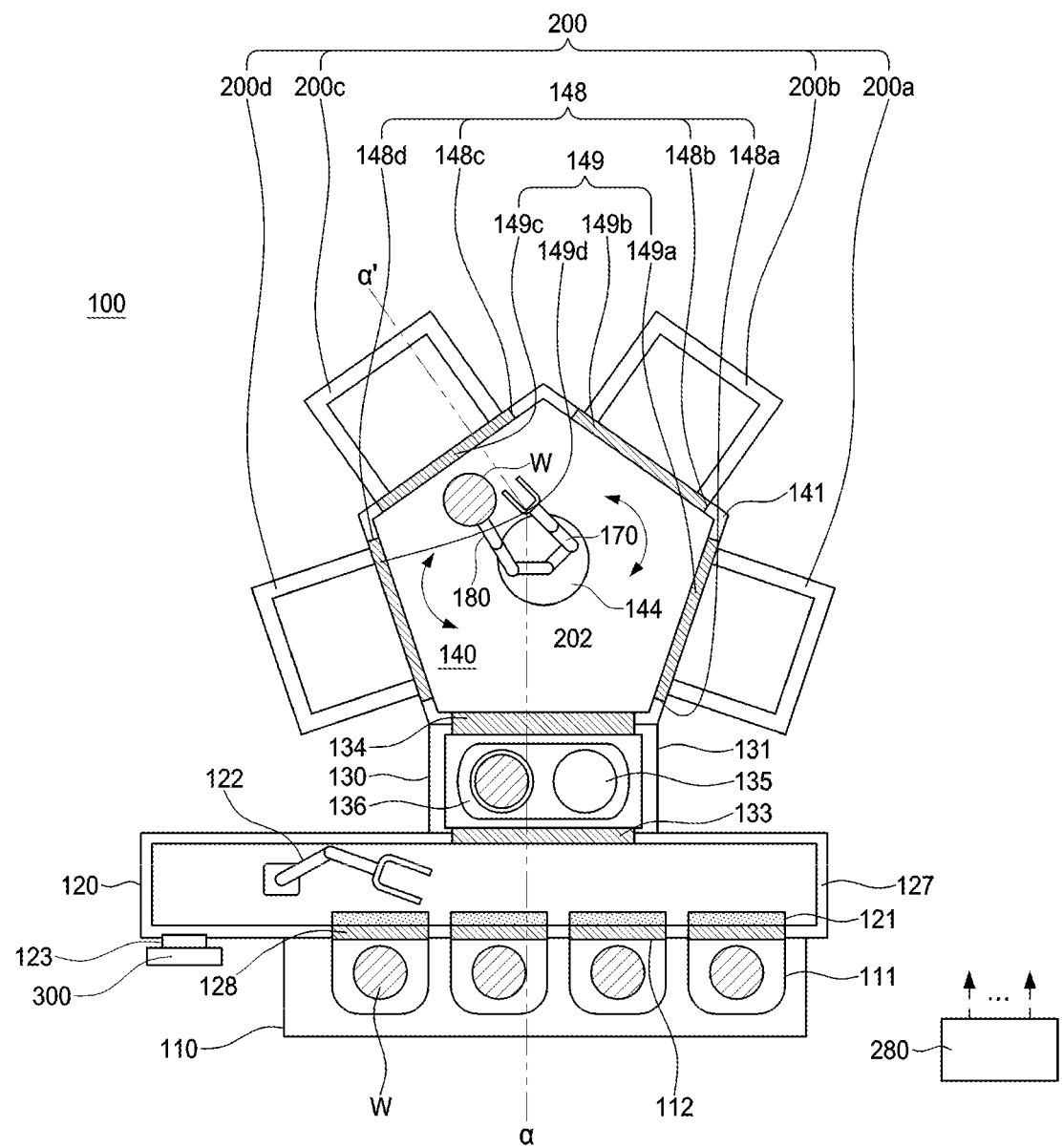
FIG. 2 schematically illustrates a horizontal cross-section of a substrate processing apparatus according to the embodiments described herein.
Figure 3:
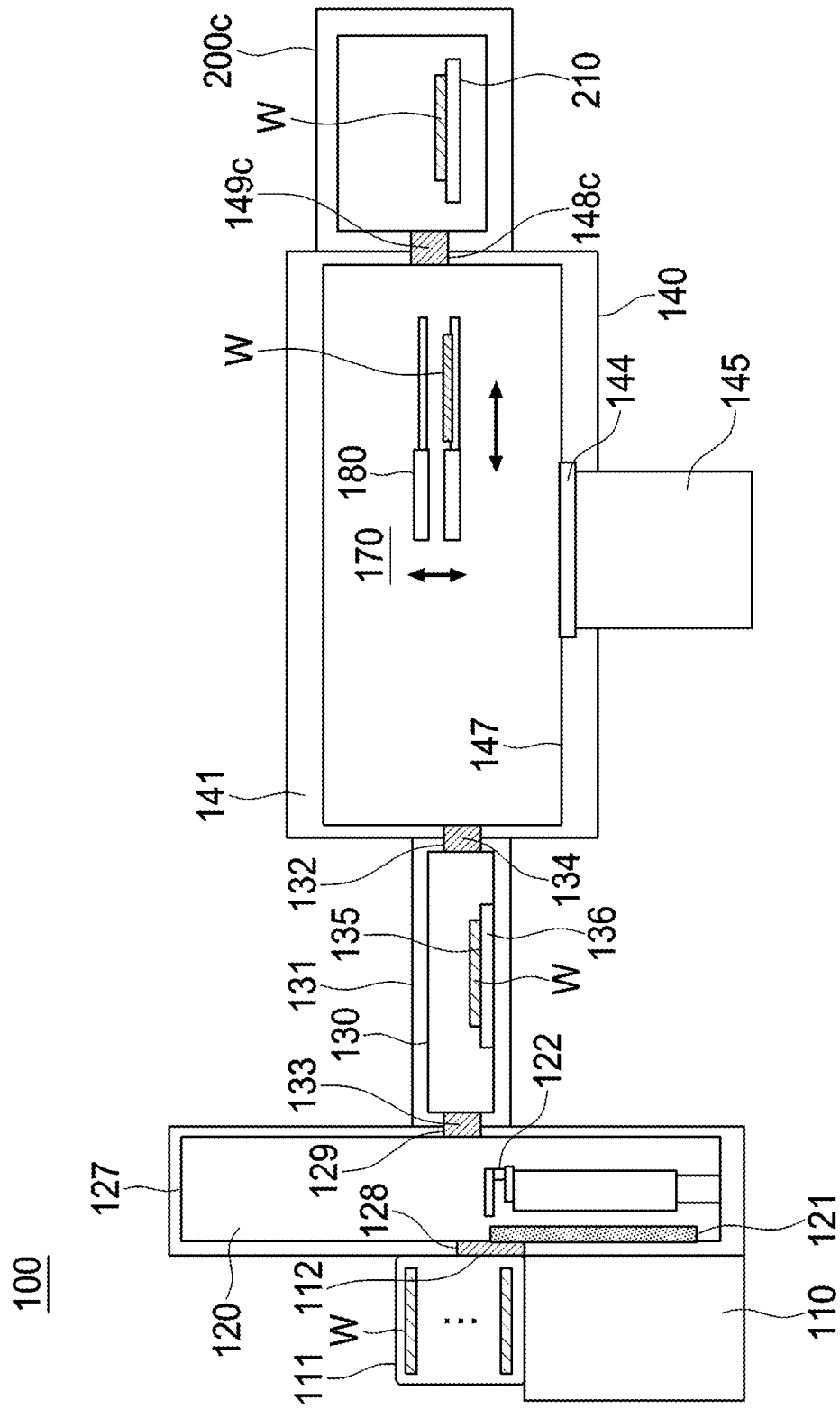
FIG. 3 schematically illustrates a cross-section taken along the line α-α' of the substrate processing apparatus shown in FIG. 2.

First, the substrate processing apparatus 100 will be described with reference to FIGS. 2 and 3. FIG. 2 schematically illustrates a horizontal cross-section of the substrate processing apparatus 100 according to the embodiments. FIG. 3 schematically illustrates a vertical cross-section of the substrate processing apparatus 100 taken along the line α-α' in FIG. 2.

Referring to FIG. 2 and FIG. 3, the substrate processing apparatus 100 according to the embodiments is capable of processing a wafer W serving as a substrate. The substrate processing apparatus 100 is constituted mainly by an I/O stage 110, an atmospheric transfer chamber 120, a load lock chamber 130, a vacuum transfer chamber 140 and a reactor (RC) 200. The substrate processing apparatus 100 is arranged in the CR 400 such that the I/O stage 110 faces the main corridor 403.

<Atmospheric Transfer Chamber and I/O stage>

The I/O stage 110 is provided at a front side of the substrate processing apparatus 100. The I/O stage 110 may also be referred to as a "loading port shelf". A plurality of pods 111 may be placed on the I/O stage 110. The pod 111 is used as a carrier for transferring the wafer W such as a silicon (Si) substrate.

The I/O stage 110 is provided adjacent to the atmospheric transfer chamber 120. The load lock chamber 130, which will be described later, is connected to a side of the atmospheric transfer chamber 120 other than the side at which the I/O stage 110 is provided. An atmospheric transfer robot 122 configured to transfer the wafer W is provided in the atmospheric transfer chamber 120.

A substrate loading/unloading port 128 and a pod opener 121 for transferring the wafer W into or out of the atmospheric transfer chamber 120 are provided at a front side of a housing 127 of the atmospheric transfer chamber 120. A substrate loading/unloading port 129 for transferring the wafer W into or out of the load lock chamber 130 is provided at a rear side of the housing 127 of the atmospheric transfer chamber 120. The substrate loading/unloading port 129 may be opened or closed by a gate valve 133. When the substrate loading/unloading port 129 is opened, the wafer W may be loaded into the load lock chamber 130 or unloaded out of the load lock chamber 130.

<Load Lock Chamber>

The load lock chamber 130 is provided adjacent to the atmospheric transfer chamber 120. The vacuum transfer chamber 140, which will be described later, is provided at a side of the housing 131 constituting the load lock chamber 130 other than the side of the housing 131 adjacent to the atmospheric transfer chamber 120.

A substrate support 136 having at least two placing surfaces 135, on which the wafer W may be placed, is provided in the load lock chamber 130. The distance between two of the placing surfaces 135 is determined based on the distance between end effectors of an arm of a vacuum transfer robot 170 described later.

<Vacuum Transfer Chamber>

The substrate processing apparatus 100 includes the vacuum transfer chamber (also referred to as a "transfer module") 140, that is, a transfer space in which the wafer W is transported under negative pressure. A housing 141 constituting the vacuum transfer chamber 140 is pentagonal when viewed from above. The load lock chamber 130 and the reactor 200 (that is, each of reactors 200a, 200b, 200c and 200d) where the wafer W is processed are connected to respective sides of the pentagonal housing 141. Hereinafter, the reactor may also be referred to as an "RC".

Substrate loading/unloading ports 148a, 148b, 148c and 148d, which are collectively or representatively referred to as a substrate loading/unloading port 148, are provided in the sidewalls of the housing 141 facing the reactors (RCs) 200a, 200b, 200c and 200d, respectively. For example, the substrate loading/unloading port 148c is provided in the sidewall of the housing 141 facing the reactor 200c as shown in FIG. 3. The reactors 200a, 200b, 200c and 200d are respectively provided with gate valves 149a, 149b, 149c and 149d. In the present specification, the gate valves 149a, 149b, 149c and 149d may be collectively or representatively referred to a gate valve 149. For example, the reactor 200c is provided with the gate valve 149c. While the reactor 200c provided with the substrate loading/unloading port 148c and the gate valve 149c are illustrated in FIG. 3, the similar applies to the reactors 200a, 200b and 200d. Therefore, the detailed descriptions of the reactors 200a, 200b and 200d, the substrate loading/unloading ports 148a, 148b and 148d and the gate valves 149a, 149b and 149d are omitted.

The vacuum transfer robot 170 capable of transferring the wafer W under negative pressure is provided at approximately at the center of the vacuum transfer chamber 140 with a flange 144 as a base. The vacuum transfer robot 170 serves as a transfer mechanism. The vacuum transfer robot 170 may include two arms 180. Each of the arms 180 includes an end effector on which the wafer W is placed, respectively. Each of the arms 180 is connected to the flange 144 via an arm shaft (not shown). That is, the vacuum transfer robot 170 provided with the two arms 180 may be elevated and lowered by an elevator 145 and the flange 144 while maintaining the vacuum transfer chamber 140 airtight. Only end effectors of the two arms 180 are illustrated in FIG. 3 and other components of the vacuum transfer robot 170 such as a robot shaft connected to the flange 144 are omitted for simplification.

The elevator 145 controls the elevation or rotation of the arms 180. The arms 180 may be rotated and extended around the arm shaft (not shown). By rotating and extending of the arms 180, the wafer W may be loaded into and unloaded out of the reactor 200, that is, the reactors 200a, 200b, 200c and 200d.

Figure 4:
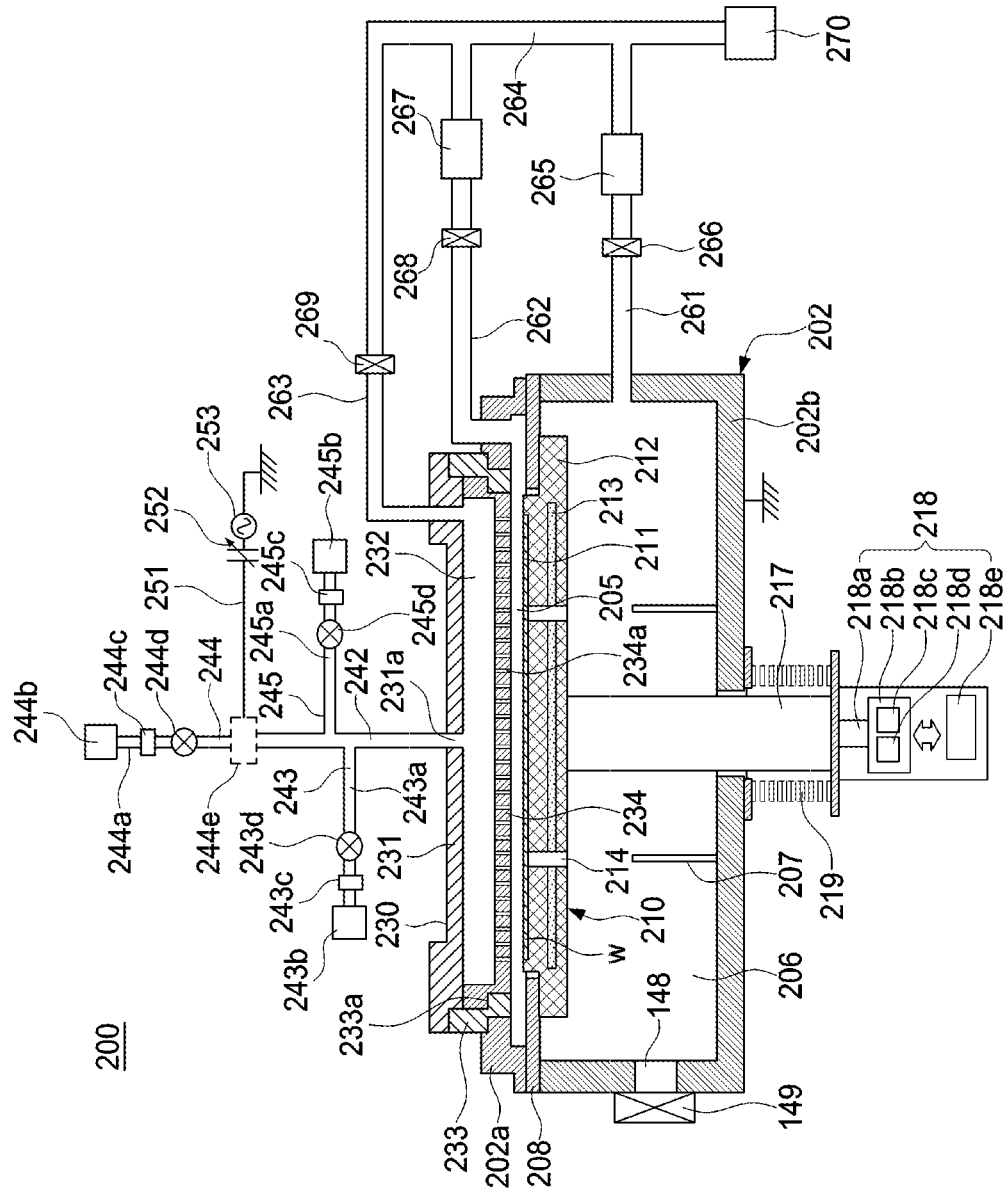
FIG. 4 schematically illustrates a configuration of a reactor (process chamber) of the substrate processing apparatus according to the embodiments described herein.

The reactors 200a, 200b, 200c and 200d serving as process chambers where the wafer W is processed are connected to the outer periphery of the vacuum transfer chamber 140. FIG. 4 schematically illustrates a configuration of the reactor 200 of the substrate processing apparatus 100 according to the embodiments described herein. Since the reactor 200a through the reactor 200d may have the same configuration, as described above, the reactor 200a, 200b, 200c and 200d are collectively or representatively referred to as the reactor 200. As such, the reactor 200 will be described in detail with reference to FIG. 4 instead of describing each of the reactors 200a, 200b, 200c and 200d.

<Vessel>

As shown in FIG. 4, the reactor 200 includes a vessel 202. The vessel 202 is a flat and sealed vessel having a circular horizontal cross-section. For example, the vessel 202 is made of a metal material such as aluminum (Al) and stainless steel (SUS). A process space 205 where the wafer W is processed and a transfer space 206 through which the wafer W is transferred into the process space 205 are provided in the vessel 202. The vessel 202 includes an upper vessel 202a and a lower vessel 202b. A partition plate 208 is provided between the upper vessel 202a and the lower vessel 202b.

The substrate loading/unloading port 148 is provided on a side surface of the lower vessel 202b adjacent to the gate valve 149. The wafer W is transferred between the vacuum transfer chamber 140 and the reactor 200 through the substrate loading/unloading port 148. Lift pins 207 are provided at the bottom of the lower vessel 202b. The lower vessel 202b is electrically grounded.

A substrate support 210 capable of supporting the wafer W is provided in the process space 205. The substrate support 210 includes a substrate support table 212 having a substrate placing surface 211 on which the wafer W is placed and a heater 213 serving as a heating source provided in the substrate support table 212. Through-holes 214 penetrated by the lift pins 207 are provided at the substrate support table 212 corresponding to the locations of the lift pins 207.

The substrate support table 212 is supported by a shaft 217. The shaft 217 penetrates the bottom of the vessel 202. The shaft 217 is connected to an elevating mechanism 218 outside the vessel 202.

The elevating mechanism 218 includes a support shaft 218a supporting the shaft 217 and an actuator 218b configured to elevate or rotate the support shaft 218a. The actuator 218b may include a lift mechanism 218c such as a motor configured to lift the support shaft 218a and a rotating mechanism 218d such as a gear configured to rotate the support shaft 218a. The elevating mechanism 218 may further include an instruction part 218e which is a part of the elevating mechanism 218 and configured to control the actuator 218b to move the support shaft 218a up and down or to rotate the support shaft 218a. The instruction part 218e may be electrically connected to a controller 280 described later. The actuator 218b may be controlled by the instruction part 218e based on an instruction from the controller 280. The wafer W placed on the substrate placing surface 211 is elevated and lowered by operating the elevating mechanism 218 by elevating and lowering the shaft 217 and the substrate support table 212. Bellows 219 covers the periphery of a lower end of the shaft 217. As a result, the interior of the process space 205 is maintained airtight.

When the wafer W is transferred, the substrate support table 212 is moved downward until the substrate placing surface 211 faces the substrate loading/unloading port 148. When the wafer W is processed, the substrate support table 212 is moved upward until the wafer W reaches a processing position in the process space 205 as shown in FIG. 4.

A shower head 230 serving as a gas dispersion mechanism is provided above (upstream of) the process space 205. A gas introduction port 231a is provided at a cover 231 of the shower head 230. The gas introduction port 231a communicates with a common gas supply pipe 242 which is described later.

The shower head 230 includes a dispersion plate 234 serving as a part of the gas dispersion mechanism for dispersing gas. A space at the upstream side of the dispersion plate 234 is referred to as a "buffer space 232" and a space at the downstream side of the dispersion plate 234 is referred to as the "process space 205". The dispersion plate 234 is provided with through-holes 234a. The dispersion plate 234 is disposed to face the substrate placing surface 211. The dispersion plate 234 is, for example, disk-shaped. The through-holes 234a are provided on the entire surface of the dispersion plate 234.

The upper vessel 202a includes a flange (not shown). A support block 233 is placed on and fixed to the flange of the upper vessel 202a. The support block 233 includes a flange 233a. The dispersion plate 234 is placed on and fixed to the flange 233a. The cover 231 is fixed to an upper surface of the support block 233. With the structure described above, it is possible to detach the cover 231, the dispersion plate 234 and the support block 233 in this order from above.

<Supply System>

The common gas supply pipe 242 is connected to the cover 231 to communicate with the gas introduction port 231a provided in the cover 231 of the shower head 230.

A first gas supply pipe 243a, a second gas supply pipe 244a and a third gas supply pipe 245a are connected to the common gas supply pipe 242. The second gas supply pipe 244a is connected to the common gas supply pipe 242 via a remote plasma mechanism (also referred to as a "remote plasma unit (RPU)") 244e serving as a part of a plasma generator (plasma generating mechanism) configured to excite the gas into a plasma state as will be described in detail later.

<First Gas Supply System>

A first gas source 243b, a mass flow controller (MFC) 243c serving as a flow rate controller (flow rate control mechanism) and a valve 243d serving as an opening/closing valve are provided at the first gas supply pipe 243a in order from the upstream side to the downstream side of the first gas supply pipe 243a. A first process gas (first gas) is supplied to the showerhead 230 via the first gas supply pipe 243a provided with the MFC 243c and the valve 243d and the common gas supply pipe 242.

The first process gas is a source gas containing a first element (hereinafter, also referred to as a "first element-containing gas"). In the present specification, the first element may include, for example, silicon (Si). That is, the first element-containing gas may include a silicon-containing gas. Specifically, gas such as hexachlorodisilane ($Si_2Cl_6$, also referred to as HCD) gas may be used as the silicon-containing gas.

A first gas supply system (hereinafter, also referred to as a "silicon-containing gas supply system") 243 is constituted mainly by the first gas supply pipe 243a, the MFC 243c and the valve 243d. The first gas supply system 243 may further include the first gas source 243b and the common gas supply pipe 242.

<Second Gas Supply System>

A second gas source 244b, an MFC 244c and a valve 244d are provided at the second gas supply pipe 244a in order from the upstream side to the downstream side of the second gas supply pipe 244a. A second process gas (second gas) is supplied to the showerhead 230 via the second gas supply pipe 244a provided with the MFC 244c and the valve 244d and the common gas supply pipe 242.

The second process gas is a gas containing a second element different from the first element (hereinafter, also referred to as a "second element-containing gas"). In the present specification, the second element may include, for example, one of oxygen (O), nitrogen (N) and carbon (C). According to the embodiments, the second element-containing gas may include an oxygen-containing gas. Specifically, oxygen ($O_2$) gas may be used as the oxygen-containing gas. The second process gas (second element-containing gas) may serve as a reactive gas or a modification gas.

The remote plasma mechanism 244e may be provided at the second gas supply pipe 244a to process the wafer W with the second gas in the plasma state. A wiring 251 is connected to the remote plasma mechanism 244e. A power supply 253 is provided on the upstream side of the wiring 251. A frequency matching mechanism 252 is provided between the remote plasma mechanism 244e and the power supply 253. Plasma is generated by the remote plasma mechanism 244e by adjusting the matching parameter by the frequency matching mechanism 252 while power is supplied from the power supply 253. According to the embodiments, the remote plasma mechanism 244e, the wiring 251 and the frequency matching mechanism 252 are collectively referred to as the plasma generator (plasma generating mechanism). The plasma generator may further include the power supply 253.

The second gas supply system (also referred to as an "oxygen-containing gas supply system") 244 is constituted mainly by the second gas supply pipe 244a, the WC 244c and the valve 244d. The second gas supply system 244 may further include the second gas source 244b and the common gas supply pipe 242.

<Third Gas Supply System>

A third gas source 245b, an WC 245c and a valve 245d are provided at the third gas supply pipe 245a in order from the upstream side to the downstream side of the third gas supply pipe 245a. An inert gas (third gas) is supplied to the showerhead 230 via the third gas supply pipe 245a provided with the WC 245c and the valve 245d and the common gas supply pipe 242.

For example, the inert gas includes nitrogen ($N_2$) gas. In a substrate processing described later, the inert gas serves as a purge gas for purging the gas remaining in the vessel 202 or in the shower head 230.

The third gas supply system 245 is constituted mainly by the third gas supply pipe 245a, the MFC 245c and the valve 245d. The third gas supply system 245 may further include the third gas source 245b and the common gas supply pipe 242.

<Exhaust System>

An exhaust system configured to exhaust an inner atmosphere of the vessel 202 includes a plurality of exhaust pipes connected to the vessel 202. Specifically, the exhaust system includes an exhaust pipe (first exhaust pipe) 262 connected to the process space 205, an exhaust pipe (second exhaust pipe) 261 connected to the transfer space 206. An exhaust pipe (third exhaust pipe) 264 is connected to the exhaust pipes 262 and 261 at the downstream sides of the exhaust pipes 261 and 262. In addition, the exhaust system may further include an exhaust pipe (fourth exhaust pipe) 263 connected to the buffer space 232. The fourth exhaust pipe 263 is connected to the third exhaust pipe 264.

The exhaust pipe 261 is provided at a side portion or a lower portion of the transfer space 206. An APC (Automatic Pressure Controller) 265 serving as a pressure controller (pressure adjusting mechanism) configured to adjust at least one of an inner pressure of the process space 205 and an inner pressure of the transfer space 206 to a predetermined pressure is provided at the exhaust pipe 261. The APC 265 includes a valve body (not shown) capable of adjusting the opening degree thereof. The APC 265 is configured to adjust the conductance of the exhaust pipe 261 in accordance with an instruction from the controller 280 described later. A valve 266 serving as a first exhaust valve for the transfer space 206 is provided on the upstream side of the APC 265 at the exhaust pipe 261.

The exhaust pipe 262 is provided at a side portion of the process space 205. An APC (Automatic Pressure Controller) 267 serving as a pressure controller (pressure adjusting mechanism) configured to adjust the inner pressure of the process space 205 to a predetermined pressure is provided at the exhaust pipe 262. The APC 267 includes a valve body (not shown) capable of adjusting the opening degree thereof. The APC 267 is configured to adjust the conductance of the exhaust pipe 262 in accordance with an instruction from the controller 280 described later. A valve 268 is provided on the upstream side of the APC 265 at the exhaust pipe 261. In the present specification, the exhaust pipe 262, the valve 268 and the APC 267 are collectively referred to as "process chamber exhaust system".

The exhaust pipe 263 is connected to the shower head 230 so as to communicate with the buffer space 232. A valve 269 is provided at the exhaust pipe 263. In the present specification, the exhaust pipe 263 and the valve 269 are collectively referred to as "shower head exhaust system".

A dry pump (DP) 270 is provided at the exhaust pipe 264. As shown in FIG. 4, the exhaust pipe 263, the exhaust pipe 262 and the exhaust pipe 261 are connected to the dry pump 270 in order from the upstream side of the exhaust pipe 264, and the dry pump 270 is provided at the downstream side of the location where the exhaust pipes 263, 262 and 261 are connected to the exhaust pipe 264. The DP 270 exhausts the atmospheres of the buffer space 232, the process space 205 and the transfer space 206 through the exhaust pipe 262, the exhaust pipe 263 and the exhaust pipe 261, respectively. For example, an air valve may be used as the valves of the exhaust system described above.

<Controller>

Figure 5:
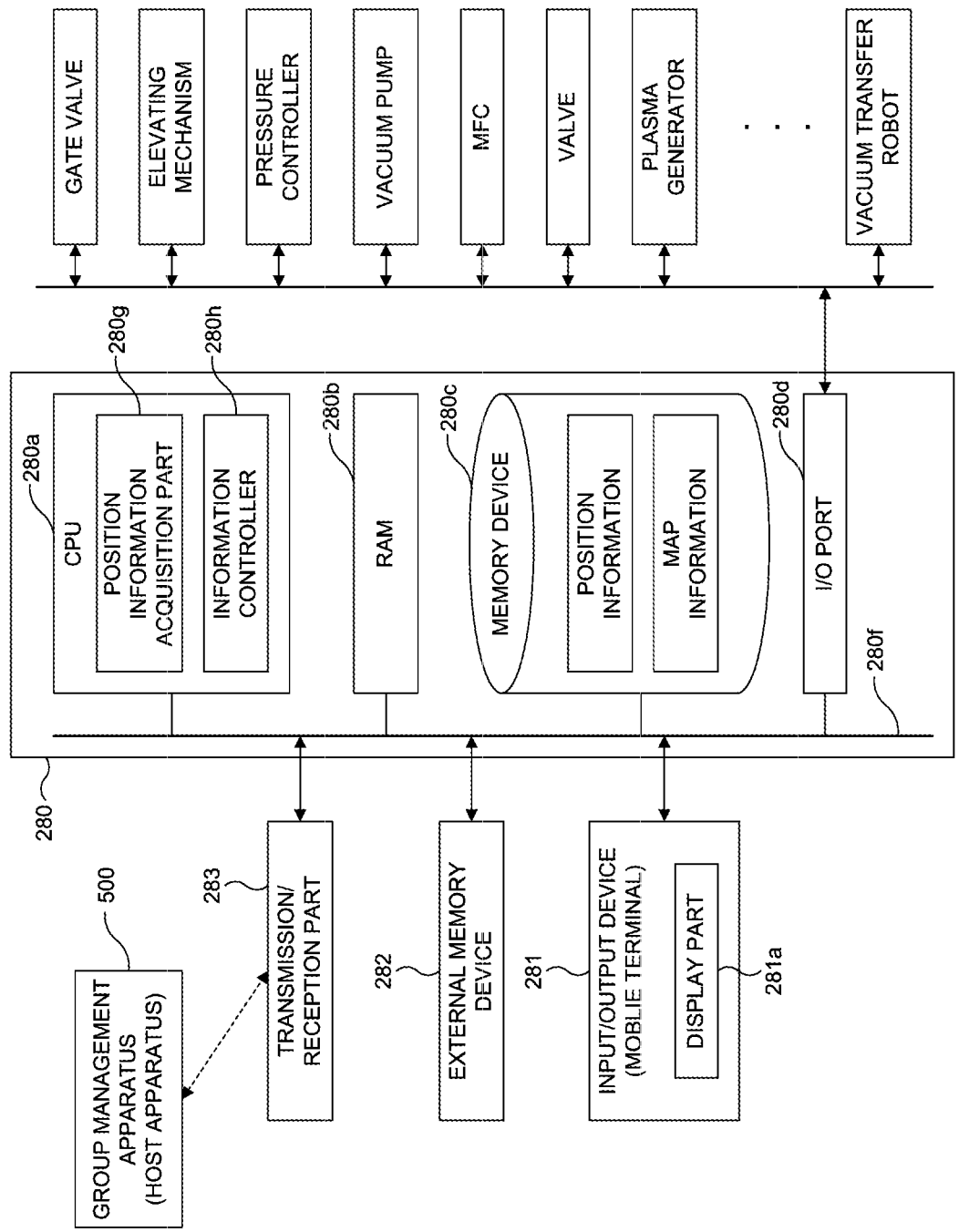
FIG. 5 is a block diagram schematically illustrating a configuration of a controller and components controlled by the controller of the substrate processing apparatus according to the embodiments described herein.

The substrate processing apparatus 100 includes the controller 280 configured to control the operations of the components of the substrate processing apparatus 100, and may further include an input/output device 281 or a transmission/reception part 283 described later. FIG. 5 is a block diagram schematically illustrating a configuration of the controller 280 and components controlled by the controller of the substrate processing apparatus 100 according to the embodiments described herein.

As shown in FIG. 5, the controller 280 may be embodied by a computer including a central processing unit (CPU) 280a, a random access memory (RAM) 280b, a memory device 208c and an I/O port 280d. The RAM 280b, the memory device 280c and the I/O port 280d are capable of exchanging data with the CPU 280a via an internal bus 280f.

An input/output device 281 configured as a portable mobile terminal such as a tablet terminal is electrically connected to the controller 280. It is possible to input information to the controller 280 by the input/output device 281. In addition, it is possible to display the information on the input/output device 281 under the control of the controller 280. That is, the input/output device 281 is configured to include a display part 281a configured to display the information. Since the input/output device 281 is configured as the mobile terminal, the input/output device 281 may be detached from the controller 280. Even in a state where the input/output device 281 is detached from the controller 280, the CPU 280a is capable of exchanging data with the input/output device 281 configured as the mobile terminal.

In addition to the input/output device 281, an external memory device 282 may be electrically connected to the controller 280. A transmission/reception part 283 is electrically connected to the controller 280 via a network. The controller 280 may be connected to the network via the transmission/reception part 283. That is, the controller 280 can be connected to the group management apparatus 500 serving as the host apparatus existing on the network via the network. The controller 280 can transmit and receive information to and from the group management apparatus 500 on the network via the transmission/reception part 283.

The memory device 280c of the controller 280 is embodied by components such as a flash memory and a hard disk drive (HDD). A control program for controlling the operation of the substrate processing apparatus 100, a process recipe having information such as sequences and conditions of the substrate processing described later, and information such as position information and map information described later, are readably stored in the memory device 280c. The process recipe is obtained by combining steps of the substrate processing described later such that the controller 280 can execute the steps to acquire a predetermine result, and functions as a program. Hereinafter, the process recipe and the control program may be collectively referred to as "program". In the present specification, the term "program" may indicate only the process recipe, indicate only the control program, or indicate both of the process recipe and the control program. The RAM 280b functions as a memory area (work area) where a program or data read by the CPU 280a is temporarily stored.

The I/O port 280d is connected to components provided in the semiconductor processing apparatus 100 such as the gate valve 149 (that is, the gate valves 149a, 149b, 149c and 149d), an elevating mechanism 218 provided at the reactor 200 (that is, each of the reactors 200a, 200b, 200c and 200d), the valves 243d, 244d, 245d, 266, 268 and 269, and the remote plasma mechanism (RPU) 244e.

The CPU 280a is configured to read a control program from the memory device 280c and execute the read control program. Furthermore, the CPU 280a is configured to read a process recipe from the memory device 280c according to an operation command inputted from the input/output device 281. According to the contents of the read process recipe, the CPU 280a may be configured to control various operations such as opening/closing operations of the gate valves 149a, 149b, 149c and 149d, an operation of the vacuum transfer robot 170, an elevating and lowering operation of the elevating mechanism 218, an ON/OFF control operation of the dry pump 270, flow rate adjusting operations of the MFCs 243c, 244c and 245c, and operations of the valves 243d, 244d, 245d, 266, 268 and 269. In addition, by executing the read control program, the CPU 280a may be configured to function as a position information acquisition part 280g and an information controller 280h, which will be described later in detail.

The controller 280 is not limited to a dedicated computer. The controller 280 may be embodied by a general-purpose computer. The controller 280 may be embodied by installing the above-described program stored in the external memory device 282 into a computer. For example, the external memory device 282 may include a magnetic tape, a magnetic disk such as a flexible disk and a hard disk, an optical disk such as a CD and a DVD, a magneto-optical disk such as MO, and a semiconductor memory such as a USB memory (USB flash drive) and a memory card. The means for providing the program to the computer is not limited to the external memory device 282. The program may be directly provided to the computer by a communication means such as Internet and a dedicated line instead of the external memory device 282. The program may be provided to the computer by receiving information from the group management apparatus 500 serving as the host apparatus via the transmission/reception part 283 instead of the external memory device 282. The controller 280 may be operated in accordance with an instruction inputted from the input/output device 281.

The memory device 280c of the controller 280 or the external memory device 282 connected to the controller 280 may be embodied by a non-transitory computer readable recording medium. Hereafter, the memory device 280c and the external memory device 282 are collectively referred to as recording media. In the present specification, the term "recording media" may indicate only the memory device 280c, indicate only the external memory device 282, and indicate both of the memory device 280c and the external memory device 282.

(4) Substrate Processing

Figure 6:
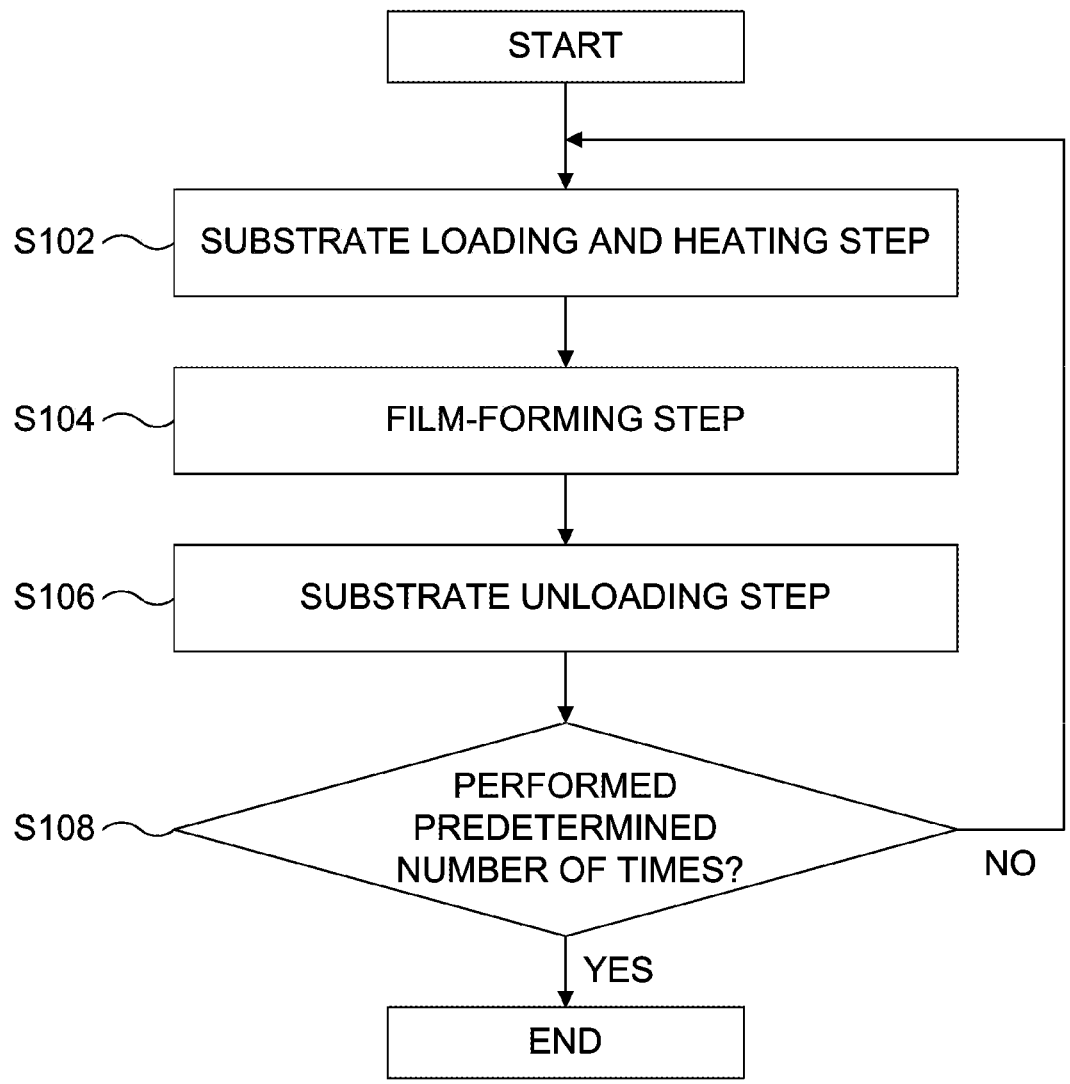
FIG. 6 is a flowchart schematically illustrating a substrate processing performed by the substrate processing apparatus according to the embodiments described herein.

Hereinafter, the substrate processing of performing a predetermined process on the wafer W using the above-described substrate processing apparatus 100 will be described. FIG. 6 is an exemplary flowchart schematically illustrating the substrate processing performed by the substrate processing apparatus 100 according to the embodiments described herein. In the embodiments, the substrate processing will be described by way of an example in which a film is formed on the wafer W using the substrate processing apparatus 100. In the following descriptions, the operations of the components constituting the substrate processing apparatus 100 are controlled by the controller 280.

<Substrate Loading and Heating Step S102>

Hereinafter, a substrate loading and heating step S102 will be described. In the substrate loading and heating step S102, the wafer W is loaded into the vessel 202. After the wafer W is loaded into the vessel 202, the vacuum transfer robot 170 is retracted to the outside of the vessel 202, and the gate valve 149 is closed to seal to seal the vessel 202 hermetically. Thereafter, by elevating the substrate support table 212, the wafer W is placed on the substrate placing surface 211 on the substrate support table 212. By further elevating the substrate support table 212, the wafer W is elevated to a position for processing the wafer W (substrate processing position) in the process space 205 described above.

After the wafer W is loaded into the transfer space 206 and elevated to the substrate processing position in the process space 205, the valves 266 and 269 are closed. As a result, the APC 265 is blocked from the transfer space 206 (and the exhaust pipe 264 is blocked from the buffer space 232), and thus the exhaust of the transfer space 206 by the APC 265 is terminated. In addition, by opening the valve 268, the process space 205 is enabled to communicate with the APC 267, and the APC 267 is enabled to communicate with the dry pimp (DP) 270. The APC 267 controls the exhaust flow rate of the process space 205 by the DP 270 by adjusting the conductance of the exhaust pipe 262. The inner pressure of the process space 205 is thereby maintained at a predetermined pressure (for example, a high vacuum ranging from $10^{-5}$ Pa to $10^{-1}$ Pa).

In the substrate loading and heating step S102, the inner pressure of the process space 205 is adjusted to the predetermined pressure and a surface temperature of the wafer W is adjusted to a predetermined temperature. The surface temperature of the wafer W may range, for example, from room temperature to 500° C., preferably from room temperature to 400° C. The inner pressure of the process space 205 may range, for example, from 50 Pa to 5,000 Pa.

<Film-Forming Step S104>

Hereinafter, a film-forming step S104 will be described. After the wafer W is elevated to the substrate processing position in the process space 205, the film-forming step S104 is performed by the substrate processing apparatus 100. In the film-forming step S104, a film is formed on the wafer W according to the process recipe by supplying the first process gas (first element-containing gas) and the second process gas (second element-containing gas) different from the first process gas into the process space 205. In the film-forming step S104, a CVD (chemical vapor deposition) process may be performed by supplying the first process gas and the second process gas into the process space 205 simultaneously, or a cyclic (alternate supply) process may be performed by alternately repeating the steps of supplying the first process gas and the second process gas. In addition, the remote plasma mechanism 244e may be activated when the second process gas as a plasma state is supplied the process space 205. The film-forming step S104 will be described later in detail.

<Substrate Unloading Step S106>

Hereinafter, a substrate unloading step S106 will be described. After the film-forming step S104 is completed, the substrate unloading step S106 is performed by the substrate processing apparatus 100. In the substrate unloading step S106, the processed wafer W is unloaded out of the vessel 202 in the order reverse to that of the substrate loading and heating step S102. Subsequent to the determination step S108 described later, unprocessed wafer W waiting for the next process will be loaded into the vessel 202 in the sequence same as that of the substrate loading and heating step S201. The loaded wafer W will be subject to the film-forming step S104 thereafter.

<Determination Step S108>

Hereinafter, the determination step S108 will be described. After the substrate unloading step S106 is completed, in the determination step S108, the controller 280 determines whether a cycle including the substrate loading step S102, the film-forming step S104 and the substrate unloading step S106 has been performed a predetermined number of times. When the controller 280 determines, in the determination step S108, that the cycle has not been performed the predetermined number of times ("NO" in FIG. 6), the substrate loading step S102, the film-forming step S104 and the substrate unloading S106 are performed again to process the unprocessed wafer. That is, the unprocessed wafer W to be processed next is loaded into the vessel 202 by performing the substrate loading step S102. Thereafter, the film-forming step S104 and the substrate unloading step S106 are performed for the unprocessed wafer W. When the controller 280 determines, in the determination step S108, that the cycle has been performed the predetermined number of times ("YES" in FIG. 6), the substrate processing is terminated.

(5) Detailed Description of Film-Forming Step

Figure 7:
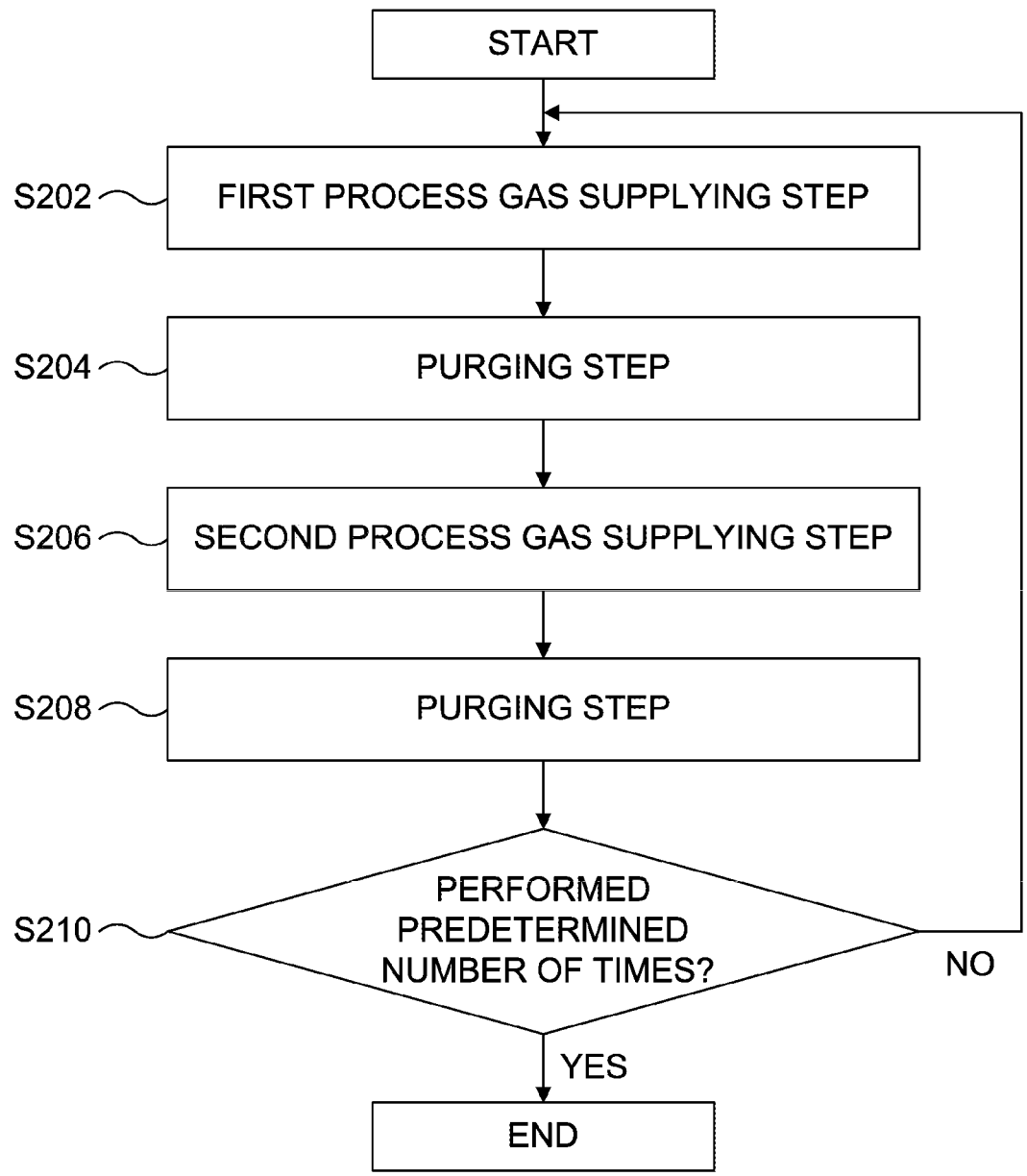
FIG. 7 is a flowchart schematically illustrating a film-forming step performed by the substrate processing apparatus according to the embodiments described herein.

Hereinafter, the film-forming step S104 of the above-described substrate processing will be described in detail. FIG. 7 is an exemplary flowchart schematically illustrating the film-forming step S104 performed by the substrate processing apparatus 100 according to the embodiments described herein. Hereinafter, the film-forming step S104 will be described by way of an example in which a silicon oxide film (hereinafter, also referred to as a "SiO film") serving as a silicon-containing film on the wafer W by alternately supplying HCD gas obtained by vaporizing HCD as the first process gas (first element-containing gas) and $O_2$ gas as the second process gas (second element-containing gas).

<First Process Gas Supplying Step S202>

Hereinafter, a first process gas supplying step S202 will be described. At first in the film-forming step S104, the HCD gas serving as the first process gas (first element-containing gas) is supplied into the process space 205 through the first gas supply system 243. The HCD gas supplied into the process space 205 is then supplied onto the surface of the wafer W at the substrate processing position. By the HCD gas contacting the surface of the wafer W, a silicon-containing layer serving as a first element-containing layer is formed on the surface of the wafer W. For example, the silicon-containing layer having a predetermined thickness and a predetermined distribution is formed according to the conditions such as an inner pressure of the vessel 202 (that is, the inner pressure of the process space 205), the flow rate of the HCD gas supplied into the process space 205, the temperature of the substrate support table 212 and the time taken for the HCD gas to pass through the process space 205.

After a predetermined time elapses from the supply of the HCD gas, the valve 243d is closed to stop the supply of the HCD gas. In the first process gas supplying step S202, the valve 268 is opened, and the inner pressure of the process space 205 is controlled (adjusted) by the APC 267 to a predetermined pressure. In the first process gas supplying step S202, the valves of the exhaust system other than the valve 268 are closed.

<Purging Step S204>

Hereinafter, a purging step S204 will be described. After the first process gas supplying step S202 is completed, $N_2$ gas is supplied through the third gas supply pipe 245a to purge the process space 205 and the shower head 230. As a result, such portion of the HCD gas that could not be bonded to the wafer W in the first process gas supplying step S202 is removed from the process space 205 by the DP 270. In addition, the HCD gas remaining in the shower head 230 (buffer space 232) is removed from the buffer space 232 by the DP 270.

<Second Process Gas Supplying Step S206>

Hereinafter, a second process gas supplying step S206 will be described. After the purging step S204 is completed, in the second process gas supplying step S206, the $O_2$ gas serving as the second process gas (second element-containing gas) is supplied into the process space 205 through the second gas supply system 244. The $O_2$ gas may be excited into plasma by the remote plasma mechanism (RPU) 244e and then irradiated onto the surface of the wafer W at the substrate processing position. By supplying the $O_2$ gas into the process space 205, the silicon-containing layer formed on the surface of the wafer W is modified (changed) to form, for example, a silicon oxide film (SiO film) which is a layer containing silicon (Si) and oxygen (O).

After a predetermined time elapses from the supply of the $O_2$ gas, the valve 244d is closed to stop the supply of the $O_2$ gas. Similar to the first process gas supplying step S202, in the second process gas supplying step S206, the valve 268 is opened, and the inner pressure of the process space 205 is controlled (adjusted) by the APC 267 to a predetermined pressure. In the second process gas supplying step S206, the valves of the exhaust system other than the valve 268 are closed.

<Purging Step S208>

Hereinafter, a purging step S208 will be described. After the second process gas supplying step S206 is completed, the purging step S208 is performed. The operations of the components of the substrate processing apparatus 100 in the purging step S208 is similar to those of the components in the purging step S204. Therefore, the detailed descriptions of the purging step S208 are omitted.

<Determination Step S210>

Hereinafter, a determination step S210 will be described. After the purging step S208 is completed, in the determination step S210, the controller 280 determines whether a cycle including the first process gas supplying step S202 through the purging step S208 has been performed a predetermined number of times (n times). When the controller 280 determines, in the determination step S210, that the cycle has not been performed the predetermined number of times (n times) ("NO" in FIG. 7), the first process gas supplying step S202 through the purging step S208 are performed again. When the controller 280 determines, in the determination step S210, that the cycle has been performed the predetermined number of times (n times) ("YES" in FIG. 7), the film-forming step is terminated.

As described above, in the film-forming step S104, by sequentially performing the first process gas supplying step S202 through the purging step S208, the silicon oxide film having a predetermined thickness is deposited on the surface of the wafer W. By performing the cycle including the first process gas supplying step S202 through the purging step S208 a predetermined number of times, it is possible to control the thickness of the silicon oxide film formed on the surface of the wafer W to a desired thickness.

(6) Configuration of Group Management Apparatus

Figure 8:
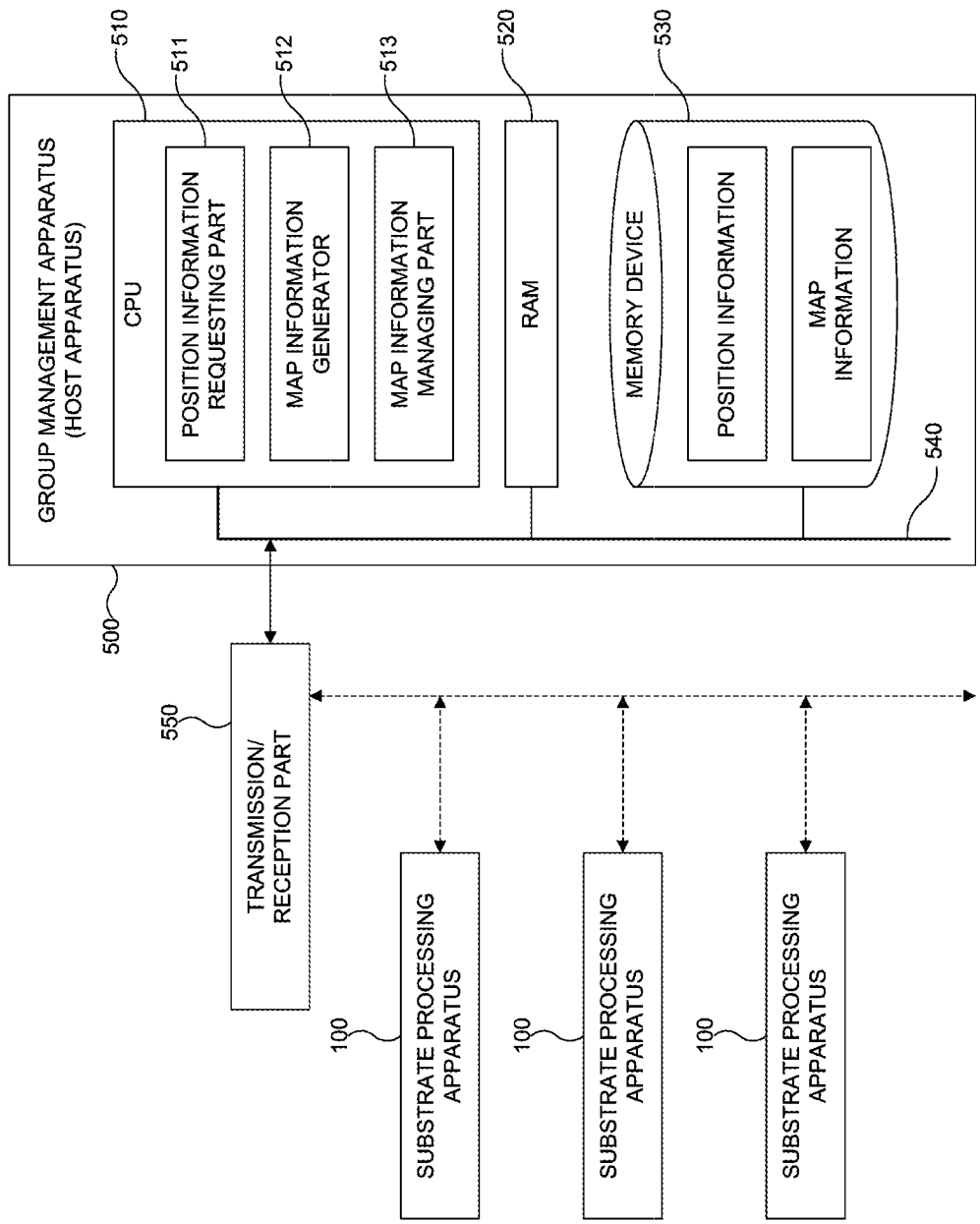
FIG. 8 schematically illustrates a configuration of a group management apparatus according to the embodiments described herein.

Hereinafter, an exemplary configuration of the group management apparatus 500 serving as the host apparatus of the substrate processing apparatus 100 will be described. FIG. 8 schematically illustrates the exemplary configuration of the group management apparatus 500 according to the embodiments described herein.

As shown in FIG. 8, the group management apparatus 500 according to the embodiments may be embodied by a computer including at least a CPU 510, a RAM 520 and a memory device 530. The RAM 520 and the memory device 530 are capable of exchanging data with the CPU 510 via an internal bus 540.

The group management apparatus 500 may be connected to a network via a transmission/reception part 550. That is, the group management apparatus 500 can be connected to each of the plurality of substrate processing apparatuses 100 provided in the CR 400 via the network. The group management apparatus 500 can transmit and receive information to and from each of the plurality of the substrate processing apparatuses 100 on the network by the transmission/reception part 550.

The memory device 530 of the group management apparatus 500 is embodied by components such as a flash memory and a hard disk drive (HDD). For example, programs such as a management program for managing each substrate processing apparatus 100 and a control program for performing a control operation on the map information described later, are readably stored in the memory device 530. The RAM 520 functions as a memory area (work area) where a program or data read by the CPU 510 is temporarily stored.

The CPU 510 is configured to read a program from the memory device 530 and execute the read program. Then, by executing the read program, the CPU 510 may function as a position information requesting part 511, a map information generator 512 and a map information managing part 513 as will be described in detail later.

Similar to the controller 280 described above, the group management apparatus 500 is not limited to a dedicated computer. The group management apparatus 500 may also be embodied by a general-purpose computer. Further, the group management apparatus 500 may also be embodied by installing the above-described program into the general-purpose computer. Similar to the controller 280 described above, the means for providing the program for the computer is not particularly limited.

(7) Management Method of Substrate Processing System

Hereinafter, a method of managing each substrate processing apparatus 100 in the substrate processing system including each substrate processing apparatus 100 and the group management apparatus 500 will be described. FIG. 9 is an exemplary flowchart schematically illustrating the method of managing each substrate processing apparatus 100 of the substrate processing system according to the embodiments described herein. As shown in FIG. 9, a first step S302, a second step S304, a third step 306, a fourth step S308, a fifth step S310, a sixth step 312 and a seventh step S314 and S316 are performed by each substrate processing apparatus 100 described above or the group management apparatus 500 of the substrate processing system. For example, the second step S304, the fourth step S308 and the fifth step S310 are performed by the group management apparatus 500 and the first step S302, the third step 306, the sixth step 312 and the seventh step S314 and S316 are performed by the substrate processing apparatus 100. Hereinafter, the substrate processing apparatus 100 or the controller 280 of the substrate processing apparatus 100 may also be referred to as a "tool".

<First Step S302>

First, the first step S302 will be described. The first step S302 is performed by each substrate processing apparatus 100 described above. In the first step S302, the position information of each substrate processing apparatus 100 described later is acquired and the acquired position information is stored in the memory device 280c of the controller 280 of each substrate processing apparatus 100. Since the position information is acquired, the first step S302 may also be referred to as a "position information acquisition step". For example, the first step S302 is performed when the substrate processing apparatus 100 is installed in the CR 400 or the substrate processing apparatus 100 is relocated within the CR 400.

The position information acquired in the first step S302 is information for specifying an installation position within the CR 400 at which the substrate processing apparatus 100 is installed (in particular, an installation position at which the reactor (RC) (process chamber) 200 provided in the substrate processing apparatus 100 is installed). Specifically, for example, address information for specifying an installation section within the CR 400, in which the substrate processing apparatus 100 is installed, may be used as the position information. However, other types of information may also be used as the position information as long as the installation position within the CR 400 can be specified.

The position information is acquired by the CPU 280a of the controller 280 serving as the position information acquisition part 280g. As described above, by executing the read control program, the CPU 280a may be function as the position information acquisition part 280g. That is, the position information acquisition part 280g acquires the position information. Specifically, for example, the position information may be acquired by displaying a predetermined GUI (Graphical User Interface) screen on the display part 281a of the input/output device 281 under the control of the position information acquisition part 280g, and receiving information inputted by a person such as a manager, an operator and a maintenance worker of the substrate processing apparatus 100 via the GUI screen. However, the embodiments are not limited thereto. For example, when the position information acquisition part 280g supports the GPS (Global Positioning System) function, the position information may be acquired using the GPS function. In addition, when the position information acquisition part 280g supports the Wi-Fi function, the position information may be acquired from an external apparatus such as a Wi-Fi access point through the Wi-Fi function.

The acquired position information is stored in the memory device 280c by the CPU 280a of the controller 280 serving as the information controller 280h. As described above, by executing the read control program, the CPU 280a may function as the information controller 280h. That is, the information controller 280h causes the position information acquired by the position information acquisition part 280g to be stored in the memory device 280c. Specifically, for example, the information controller 280h causes the position information to be stored in the memory device 280c as a part of the information constituting a position information file.

In addition to the position information as the essential setting information, the position information file stored in the memory device 280c may further include the following optional setting information. Specifically, for example, the optional setting information may include information such as unique ID (identification) information of the substrate processing apparatus 100, type information of the substrate processing apparatus 100 (for example, information on the process type such as a CVD and sputtering), gas pattern information corresponding to the substrate processing apparatus 100 (for example, information on the gas type and the exhaust path), size information of the substrate processing apparatus 100 (for example, information on an installation area of the substrate processing apparatus 100 and the number of sections occupied by the substrate processing apparatus 100 in the CR 400).

<Second Step S304>

Hereinafter, the second step S304 will be described. The second step S304 is performed by the group management apparatus 500. In the second step S304, the group management apparatus 500 requests each substrate processing apparatus 100 to transmit the position information stored in the memory device 280c. Since the group management apparatus 500 requests each substrate processing apparatus 100 to transmit the position information, the second step S304 may also be referred to as a "position information request step". The second step S304 may be performed at a predetermined timing (for example, every minute, every 5 minutes and every 10 minutes).

The request for the transmission of the position information is performed by the CPU 510 of the group management apparatus 500 serving as the position information requesting part 511. As described above, by executing the read control program, the CPU 510 may function as the position information requesting part 511. That is, the position information requesting part 511 requests each substrate processing apparatus 100 to transmit the position information. Specifically, for example, the position information requesting part 511 may request the position information to each substrate processing apparatus 100 by transmitting transmission request information of a predetermined format to each substrate processing apparatus 100. The details of the transmission request information such as the format of the transmission request information are not particularly limited.

<Third Step S306>

Hereinafter, the third step S306 will be described. The third step S306 is performed by each substrate processing apparatus 100 described above. In the third step S306, in response to the transmission request information sent from the group management apparatus 500, each substrate processing apparatus 100 reads the position information stored in the memory device 280c and then, by the transmission/reception part 283, transmits the position information to the group management apparatus 500. Since the position information is transmitted to the group management apparatus 500, the third step S306 may also be referred to as a "position information transmission step". The third step S306 is performed when the substrate processing apparatus 100 receives the transmission request information from the group management apparatus 500. Therefore, the second step S304 and the third step S306 may be periodically performed (repeated) at a predetermined timing (for example, every minute, every 5 minutes and every 10 minutes).

The position information is read from the memory device 280c and transmitted to the group management apparatus 500 under the control of the CPU 280a of the controller 280 serving as the information controller 280h. As described above, by executing the read control program, the CPU 280a may function as the information controller 280h. That is, when the substrate processing apparatus 100 receives the transmission request information from the group management apparatus 500, the information controller 280h performs control such that the position information is read from the memory device 280c and then is outputted (transmitted) to the group management apparatus 500 in response to the transmission request information. Specifically, the information controller 280*h* is configured to cause the position information stored in the memory device 280*c* to be transmitted to the transmission/reception part 283 by designating the host apparatus as its destination when the transmission/reception part 283 receives the transmission request information for requesting the position information from the group management apparatus (host apparatus) 500.

When the memory device 280*c* stores the position information file including the position information and the optional setting information described above, the information controller 280*h* may select information to be transmitted to the group management apparatus 500. For example, the information controller 280*h* may display a check box on a GUI screen for setting the transmission of the position information file, and select the optional setting information to be transmitted to the group management apparatus 500 in addition to the position information using the check box.

<Fourth Step S308>

Hereinafter, the fourth step S308 will be described. The fourth step S308 is performed by the group management apparatus 500. In the fourth step S308, the group management apparatus 500 generates map information described later based on the position information transmitted from each substrate processing device 100. Since the map information is generated, the fourth step S308 may also be referred to as a "map information generation step". The fourth step S308 may be performed when the position information is received from the substrate processing apparatus 100.

The map information generated in the fourth step S308 is, for example, information for visually showing the arrangement (layout) of each substrate processing apparatus 100 in the CR 400 and corresponding to a map relating to the arrangement of each substrate processing apparatus 100 in the CR 400. According to the map information, for example, it is possible to easily notice where each substrate processing apparatus 100 is located in the CR 400, what kind of substrate processing apparatus 100 is arranged in the vicinity of a certain substrate processing apparatus 100. It is also possible to easily recognize the movement path in the CR 400. The map information may represent the occupation ratio of each substrate processing apparatus 100 according to the size information of each substrate processing apparatus 100. In addition, the map information may indicate an error when some of the substrate processing apparatuses 100 overlap with each other according to occupancy information.

The map information is generated by the CPU 510 of the group management apparatus 500 serving as the map information generator 512. As described above, by executing the read control program, the CPU 510 may function as the map information generator 512. That is, the map information generator 512 generates the map information. Specifically, for example, the map information generator 512 generates the map information based on predetermined map format data by fitting the contents of the position information received from each substrate processing apparatus 100 into the map format data. The details of the map format data such as the format of the map format data are not particularly limited. The map format data may be stored in the memory device 530 of the group management apparatus 500 in advance, or may be acquired from an external apparatus such as a server apparatus that the group management apparatus 500 can access through the network.

<Fifth Step S310>

Hereinafter, the fifth step S310 will be described. The fifth step S310 is performed by the group management apparatus 500. In the fifth step S310, the group management apparatus 500 transmits the map information generated in the fourth step S308 to each substrate processing device 100. Since the map information is transmitted, the fifth step S310 may also be referred to as a "map information transmission step". The fifth step S310 may be performed when the generation of the map information by the map information generator 512 is completed.

The map information is transmitted by the CPU 510 of the group management apparatus 500 serving as the map information managing part 513. As described above, by executing the read control program, the CPU 510 may function as the map information managing part 513. That is, the map information managing part 513 transmits the map information. Specifically, for example, the map information managing part 513 transmits the map information to each substrate processing device 100 such that the map information is stored in the memory device 280*c* of each substrate processing device 100 and displayed by the display part 281*a* of the input/output device 281 of each substrate processing device 100.

<Sixth Step S312>

Hereinafter, the sixth step S312 will be described. The sixth step S312 is performed by each substrate processing apparatus 100 described above. In the sixth step S312, when the substrate processing apparatus 100 receives the map information from the group management apparatus 500 by the transmission/reception part 283, the map information is stored in the memory device 280*c* and then displayed on the display part 281*a* of the input/output device 281 of the substrate processing device 100. Since the map information is displayed, the sixth step S312 may also be referred to as a "map information display step". The sixth step S312 is performed when the substrate processing apparatus 100 receives the map information from the group management apparatus 500.

The map information is stored in the memory device 280*c* of each substrate processing device 100 and then displayed on the display part 281*a* of the input/output device 281 of each substrate processing device 100 under the control of the CPU 280*a* of the controller 280 serving as the information controller 280*h*. As described above, by executing the read control program, the CPU 280*a* may function as the information controller 280*h*. That is, the information controller 280*h* causes the map information received from the group management apparatus 500 to be stored in the memory device 280*c* and the map information to be displayed on the display part 281*a* of the input/output device 281.

The input/output device 281 including the display part 281*a* configured to display the map information is constituted by a mobile terminal such as a tablet terminal. Accordingly, even when the input/output device 281*b* is remote from the controller 280, the person such as the manager, the operator and the maintenance worker of the substrate processing apparatus 100 can easily understand the surrounding conditions and the movement path related to the substrate processing apparatus 100 by detaching the input/output device 281 from the controller 280 and carrying the input/output device 281.

<Seventh Step S314 and S316>

Hereinafter, the seventh step S314 and S316 will be described. The seventh step S314 and S316 is performed by each substrate processing apparatus 100 described above. The seventh step S314 and S316 is performed when the substrate processing apparatus 100 receives the map information from the group management apparatus 500.

At first in the seventh step, the map information received from the group management apparatus 500 are compared with the map information already stored in the memory device 280c, and it is determined whether there is a difference between them. That is, it is determined whether the map information has been changed (S314). If it is determined that the map information has been changed, which means the installation conditions of the substrate processing apparatus 100 in the CR 400 have been changed, message information indicating that the installation conditions have been changed is outputted (S316). Since the message information is outputted, the seventh step S314 and S316 may also be referred to as a "message output step".

The CPU 280a of the controller 280 serving as the information controller 280h compares the map information received from the group management apparatus 500 and the map information stored in the memory device 280, and determines whether there is a difference between them and outputs the message information. As described above, by executing the read control program, the CPU 280a may function as the information controller 280h. That is, when the substrate processing apparatus 100 receives the map information from the group management apparatus 500, the information controller 280h compares the map information received from the group management apparatus 500 and the map information stored in the memory device 280, and determines whether there is a difference between them and outputs the message information when it is determined that the map information has been changed.

The message information outputted by the information controller 280h may be configured in a predetermined format. However, the details of the message information such as the format of the message information are not particularly limited as long as it can notify that the installation conditions of the substrate processing apparatus 100 have been changed.

The message information may be outputted to at least one of the display part 281a of the input/output device 281 and the group management apparatus 500. Preferably, the message information is outputted to both of the display part 281a and the group management apparatus 500. Therefore, it is possible to notify at least one of the manager, the operator and the maintenance worker of the substrate processing apparatus 100 that the installation conditions of the substrate processing apparatus 100 have been changed.

That is, by outputting the message information described above, it is possible to send a message to at least one of the manager, the operator and the maintenance worker of the substrate processing apparatus 100 to the effect that the settings of the substrate processing apparatus 100 should be checked in view of the change in the installation conditions of the substrate processing apparatus 100. As a specific example, suppose that a substrate processing apparatus 100 in a neighboring section of a certain substrate processing apparatus 100 is removed. In this case, the exhaust characteristics of the certain substrate processing apparatus 100 may be improved. This may affect the processing characteristics of the substrate processing which has been so far performed by the substrate processing apparatus 100. However, by outputting the message information according to the change in the installation conditions of the substrate processing apparatus 100, it becomes possible to request the person such as the manager to check the settings of the substrate processing apparatus 100. By checking the settings, it is possible to prevent beforehand the influence of the above change upon the processing characteristics.

According to the present embodiments, by performing the first step S302 through the seventh step S314 and S316 described above, it is possible to manage each substrate processing apparatus 100 installed in the CR 400. Particularly, the second step S304 and the third step S306 are periodically performed (repeated) at a predetermined timing (for example, every minute, every 5 minutes and every 10 minutes). That is, the position information of each substrate processing apparatus 100 installed in the CR 400 is constantly monitored at the predetermined timing. Therefore, regardless of at which timing the installation conditions of each substrate processing apparatus 100 are to be changed, it is possible to prevent beforehand the influence of the above change upon the processing characteristics of the substrate processing.

(8) Effects of the Embodiments

According to the embodiments, one or more advantageous effects described below can be achieved.

(a) According to the embodiments, in each substrate processing apparatus 100, the position information acquisition part 280g acquires the position information, and the information controller 280h causes the acquired position information to be stored in the memory device 280c. That is, the substrate processing apparatus 100 stores its own position information. Therefore, even when a plurality of substrate processing apparatuses 100 are installed in the CR 400 and the installation conditions of each substrate processing apparatus 100 are changed by, for example, installing a new substrate processing apparatus 100 in the CR 400, relocating the substrate processing apparatus 100 in the CR 400 or removing the processing apparatus 100 from the CR 400, it is possible to take measures for coping with the change quickly and appropriately.

(b) According to the embodiments, when the substrate processing apparatus 100 receives the transmission request information of the position information from the group management apparatus 500 serving as the host apparatus, the position information is read from the memory device 280c and then is outputted to the group management apparatus 500 under the control of the information controller 280h. That is, by transmitting the transmission request information to each substrate processing apparatus 100, the group management apparatus 500 can collect the position information of each substrate processing apparatus 100. Therefore, even though each substrate processing apparatus 100 stores its own position information, the position information of each substrate processing apparatus 100 can be managed appropriately by the group management apparatus 500. Specifically, by managing the position information of each substrate processing apparatus 100 collectively by the group management apparatus 500, it is possible to easily generate the map information for visually showing the arrangement (layout) of each substrate processing apparatus 100 in the CR 400.

Particularly, as described in the embodiments, the second step S304 and the third step S306 are periodically performed (repeated) at a predetermined timing to transmit the transmission request information to each substrate processing apparatus 100 and to manage the position information collectively by the group management apparatus 500. Thus, the position information of each substrate processing apparatus 100 is constantly monitored at the predetermined timing. Therefore, regardless of at which timing the installation conditions of each substrate processing apparatus 100 are to be changed, it is possible to manage each substrate processing apparatus 100 appropriately. For example, it is possible to prevent beforehand the influence of the above change upon the processing characteristics of the substrate processing.

(c) According to the embodiments, when the substrate processing apparatus 100 receives the map information from the group management apparatus 500 serving as the host apparatus, the map information is displayed on the display part 281a of the input/output device 281 of the substrate processing device 100. Therefore, by referring to the map information displayed on the display part 281a, it is possible for the person such as the manager, the operator, or the maintenance worker of the substrate processing apparatus 100 to easily notice where each substrate processing apparatus 100 is located in the CR 400 and what kind of substrate processing apparatus 100 is arranged in the vicinity of a certain substrate processing apparatus 100, and to easily recognize the movement path in the CR 400. That is, the person such as the manager, the operator, or the maintenance worker of the substrate processing apparatus 100 can manage each substrate processing apparatus 100 easily.

(d) According to the embodiments, the input/output device 281 including the display part 281a configured to display the map information may be constituted by a mobile terminal such as a tablet terminal. Accordingly, even when the input/output device 281b is remote from the controller 280, the person such as the manager, the operator and the maintenance worker of the substrate processing apparatus 100 can easily understand the surrounding conditions of the substrate processing apparatus 100 and the movement path of the CR 400 by detaching the input/output device 281 from the controller 280 and carrying the input/output device 281. That is, the person such as the manager, the operator, or the maintenance worker of the substrate processing apparatus 100 can manage each substrate processing apparatus 100 easily.

(e) According to the embodiments, when the substrate processing apparatus 100 receives the map information from the group management apparatus 500 serving as the host apparatus, the information controller 280h compares the map information received from the group management apparatus 500 and the map information stored in the memory device 280, determines whether there is a difference between them and outputs the message information to at least one of the display part 281a of the input/output device 281 and the group management apparatus 500 if there is a difference between them. By outputting the message information described above, it is possible to send a message to at least one of the manager, the operator and the maintenance worker of the substrate processing apparatus 100 to the effect that the settings of the substrate processing apparatus 100 should be checked in view of the change in the installation conditions of the substrate processing apparatus 100. By outputting the message information according to the change in the installation conditions, it is possible to request a person such as the manager to check the settings of the substrate processing apparatus 100. By checking the settings of the substrate processing apparatus 100 by the person such as the manager, it is possible to prevent beforehand the influence of the above change upon the processing characteristics of the substrate processing.

<Other Embodiments>

While the technique is described in detail by way of the above-described embodiments, the above-described technique is not limited thereto. The above-described technique may be modified in various ways without departing from the gist thereof.

The above-described embodiments are described by way of an exemplary film-forming process in which the silicon oxide film (SiO film) is formed on the wafer W by alternately supplying the HCD gas serving as the first process gas (first element-containing gas) and the $O_2$ gas serving as the second process gas (second element-containing gas). However, the above-described technique is not limited thereto. For example, the gases used in the film-forming process are not limited to the HCD gas and the $O_2$ gas. That is, the above-described technique may also be applied to film-forming processes wherein other gases are used to form different films, or three or more different gases are alternately supplied to form a film. Specifically, instead of silicon (Si), the first element may include element such as titanium (Ti), zirconium (Zr) and hafnium (Hf). Instead of oxygen (O), the second element may include element such as nitrogen (N).

The above-described embodiments are described by way of an example in which a film-forming process is performed in a substrate processing apparatus. However, the above-described technique is not limited thereto. That is, the above-described technique can be applied not only to the film-forming process for forming the film exemplified in the embodiments but also to different substrate processing. For example, the above-described techniques may be applied to an annealing process, a diffusion process, an oxidation process, a nitridation process and a lithography process. The above-described technique may also be applied to other substrate processing apparatuses such as an annealing apparatus, an etching apparatus, an oxidation apparatus, a nitridation apparatus, an exposure apparatus, a coating apparatus, a drying apparatus, a heating apparatus and combinations thereof. Further, one or more elements of the above-described examples may be substituted with one or more elements of other examples, or may be added to other examples. Further, a part of one or more elements of the above-described examples may be omitted, or substituted with or added by other elements.

Further, the above-described embodiments are described by way of an example in which the wafer is processed as one of the manufacturing process of the semiconductor device. However, the above-described technique is not limited thereto. For example, the substrate to be processed is not limited to the wafer and the above-described technique may be applied to other substrates such as a photomask, a printed wiring board, a liquid crystal panel and a magnetic disk.

According to the technique described herein, it is possible to manage the substrate processing apparatus efficiently.

What is claimed is:
1. A substrate processing apparatus comprising:
a process chamber where a substrate is processed;
a position information acquisition part configured to acquire position information of the process chamber;
a memory device configured to store the position information; and
an information controller configured to:
cause the position information acquired by the position information acquisition part to be stored in the memory device and the position information stored in the memory device to be outputted;
compare map information received from a host apparatus and map information stored in the memory device; and
output information indicating presence of a difference therebetween to at least one of a display part and the host apparatus when the map information received from the host apparatus is different from the map information stored in the memory device.

2. The substrate processing apparatus of claim 1, further comprising:
a transmission/reception part configured to transmit and receive information to and from the host apparatus,
wherein the information controller is further configured to cause the position information stored in the memory device to be transmitted to the transmission/reception part by designating the host apparatus as a destination of the position information when the transmission/reception part receives a transmission request for the position information from the host apparatus.

3. The substrate processing apparatus of claim 2, further comprising:
the display part configured to display information,
wherein the information controller is further configured to cause the map information to be stored in the memory device and to be displayed on the display part when the transmission/reception part receives the map information generated by the host apparatus based on the position information transmitted thereto.

4. The substrate processing apparatus of claim 3, wherein the display part includes a portable terminal.

5. A substrate processing system comprising a substrate processing apparatus and a host apparatus,
wherein the substrate processing apparatus comprising:
a process chamber where a substrate is processed;
a position information acquisition part configured to acquire position information of the process chamber;
a memory device configured to store the position information;
an information controller configured to:
cause the position information acquired by the position information acquisition part to be stored in the memory device and the position information stored in the memory device to be transmitted to the host apparatus in response to a transmission request for the position information transmitted from the host apparatus;
compare map information received from the host apparatus and map information stored in the memory device; and
output information indicating presence of a difference therebetween to at least one of a display part and the host apparatus when the map information received from the host apparatus is different from the map information stored in the memory device; and
the display part configured to display information, and
wherein the host apparatus comprising:
a map information generator configured to generate the map information based on the position information received from the substrate processing apparatus; and a map information managing part configured to transmit the map information generated by the map information generator to the substrate processing apparatus so as to cause the map information to be displayed on the display part.

6. The substrate processing system of claim 5, wherein the substrate processing apparatus further comprises a transmission/reception part configured to transmit and receive information to and from the host apparatus, and
wherein the information controller is further configured to cause the position information stored in the memory device to be transmitted to the transmission/reception part by designating the host apparatus as a destination of the position information when the transmission/reception part receives the transmission request from the host apparatus.

7. The substrate processing system of claim 6, wherein the information controller is further configured to cause the map information to be stored in the memory device and the map information to be displayed on the display part when the transmission/reception part receives the map information generated by the host apparatus based on the position information transmitted thereto.

8. The substrate processing system of claim 7, wherein the display part includes a portable terminal.

9. A method of manufacturing a semiconductor device by using a substrate processing apparatus comprising a process chamber, a memory device and a display part, the method comprising:
(a) acquiring position information of the substrate processing apparatus and storing the position information in the memory device;
(b) receiving a transmission request for the position information stored in the memory device;
(c) transmitting the position information stored in the memory device in response to the transmission request;
(d) receiving map information generated based on the position information transmitted in (c);
(e) storing the map information received in (d) in the memory device;
(f) displaying the map information on the display part; and
(g) comparing the map information transmitted to the substrate processing apparatus in (e) and the map information stored in the memory device of the substrate processing apparatus, and outputting information indicating presence of a difference therebetween when the map information received from the host apparatus is different from the map information stored in the memory device.

* * * * *